(12) United States Patent
Gruenewald et al.

(10) Patent No.: US 9,531,357 B2
(45) Date of Patent: Dec. 27, 2016

(54) DIGITAL CIRCUIT FOR GENERATING A PULSE-WIDTH MODULATED SIGNAL, PARTICULARLY FOR REGULATING AN ANALOG VARIABLE

(71) Applicant: Robert Bosch GmbH, Stuttgart (DE)

(72) Inventors: Martin Gruenewald, Vaihingen/Enz (DE); Axel Aue, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/614,168

(22) Filed: Feb. 4, 2015

(65) Prior Publication Data

US 2015/0222255 A1    Aug. 6, 2015

(30) Foreign Application Priority Data

Feb. 5, 2014 (DE) .......................... 10 2014 202 077

(51) Int. Cl.
- *H03K 3/017* (2006.01)
- *H03K 5/06* (2006.01)
- *H03K 5/156* (2006.01)
- *H03M 1/12* (2006.01)

(52) U.S. Cl.
CPC ................ *H03K 5/06* (2013.01); *H03K 5/156* (2013.01); *H03M 1/12* (2013.01)

(58) Field of Classification Search
None
See application file for complete search history.

(56) References Cited

U.S. PATENT DOCUMENTS

2012/0078216 A1*  3/2012  Smith ................... A61M 5/145
                                                                    604/500

\* cited by examiner

*Primary Examiner* — Cassandra Cox

(74) *Attorney, Agent, or Firm* — Norton Rose Fulbright LLP; Gerard Messina

(57) ABSTRACT

A digital circuit configuration for generating a pulse-width modulated signal, particularly for regulating an analog electrical variable using pulse-width modulation, is described in which an actual value of the analog variable present at the input of an A/D converter is converted to a digital output variable, the digital output variable of the A/D converter being provided or supplied to a comparator unit, which compares the output variable to an upper threshold value and to a lower threshold value; at the output of the comparator unit, a signal being present which indicates whether the output variable of the A/D converter lies above the upper threshold value or below the lower threshold value; and it being particularly provided that the output of the A/D converter is connected to a digital timer, using which the pulse-width ratio of a generated pulse-width modulated signal is settable.

7 Claims, 3 Drawing Sheets

DIGITAL CIRCUIT FOR GENERATING A PULSE-WIDTH MODULATED SIGNAL, PARTICULARLY FOR REGULATING AN ANALOG VARIABLE

RELATED APPLICATION INFORMATION

The present application claims priority to and the benefit of German patent application no. 10 2014 202 077.8, which was filed in Germany on Feb. 5, 2014, the disclosure of which is incorporated herein by reference.

FIELD OF THE INVENTION

The present invention relates to a digital circuit configuration for generating a pulse-width modulated signal, particularly for regulating an analog variable, according to the definition of the species in the independent claims.

BACKGROUND INFORMATION

The generation of an analog electrical variable, such as voltage or current, by integrating a digitally transmitted, pulse-width modulated (PWM) signal is known per se for DC/DC converters or switching controllers. In this case, a switch, a storage element and a special control circuit are used, such control circuits being available in different embodiments, mostly as integrated circuits. The storage element mentioned is an electric inductor or capacitor, for example.

SUMMARY OF THE INVENTION

The present invention is based on the idea of regulating a named analog electric variable (voltage, current, etc.) using pulse-width modulation and particularly by linking an A/D converter to a digital timer. The so-called "embedded" microcontrollers, which are available these days and are used for controlling electric motors of electric vehicles, and already include named A/D converters and timers, so that the linkage according to the present invention of an A/D converter to a digital timer, and particularly the construction of a direct closed loop, that is exclusively controlled or implemented by electronic components, is simple and therefore cost-effective to implement.

Using a digital circuit configuration according to the present invention, a variable concerned in this case is able to be modulated or regulated with the aid of only a few external components. For the actual regulating process, since no steady command execution of the microcontroller is required, the dead time of the circuit is considerably less. In addition, only a very slight jitter (fluctuation) of the dead time is to be expected. If the control loop is closed by the command execution of a microcontroller, then the time required for the execution of the commands leads to a substantially greater dead time. If the microcontroller additionally has further tasks, which, in practice, is usually the case, a considerable jitter of the dead time is created thereby, which is very interfering in the case of a control loop. Compared to the related art of current microcontrollers, in which the signal processing takes place using software which, based on the required data processing, leads to jitter conditioned upon running time effects or dead time effects, the present, discrete design of the circuit configuration according to the present invention, that is present instead of microcontroller, avoids the disadvantages mentioned.

In addition, the microcontroller is correspondingly unloaded, and is therefore available for other tasks. The programmability of the microcontroller may also be used to adjust the parameters for the regulation, or adapt them to instantaneous requirements.

Owing to the present invention, a regulation affected in this case may be implemented by logic structures already present, integrated in a (for instance, embedded) microcontroller. This particularly relates to systems in which microcontrollers are used in order to minimize the number of components required externally.

The present invention may particularly be applied with electric drives and/or battery supplies of electric vehicles or in the case of electric rectifiers or inverters having the advantages described herein.

Additional advantages and developments of the present invention derive from the specification and the appended figures. It will be appreciated that the features mentioned above and the features yet to be described below may be used not only in the combination given in each case but also in other combinations or individually, without departing from the scope of the present invention.

DETAILED DESCRIPTION

Figure 1:
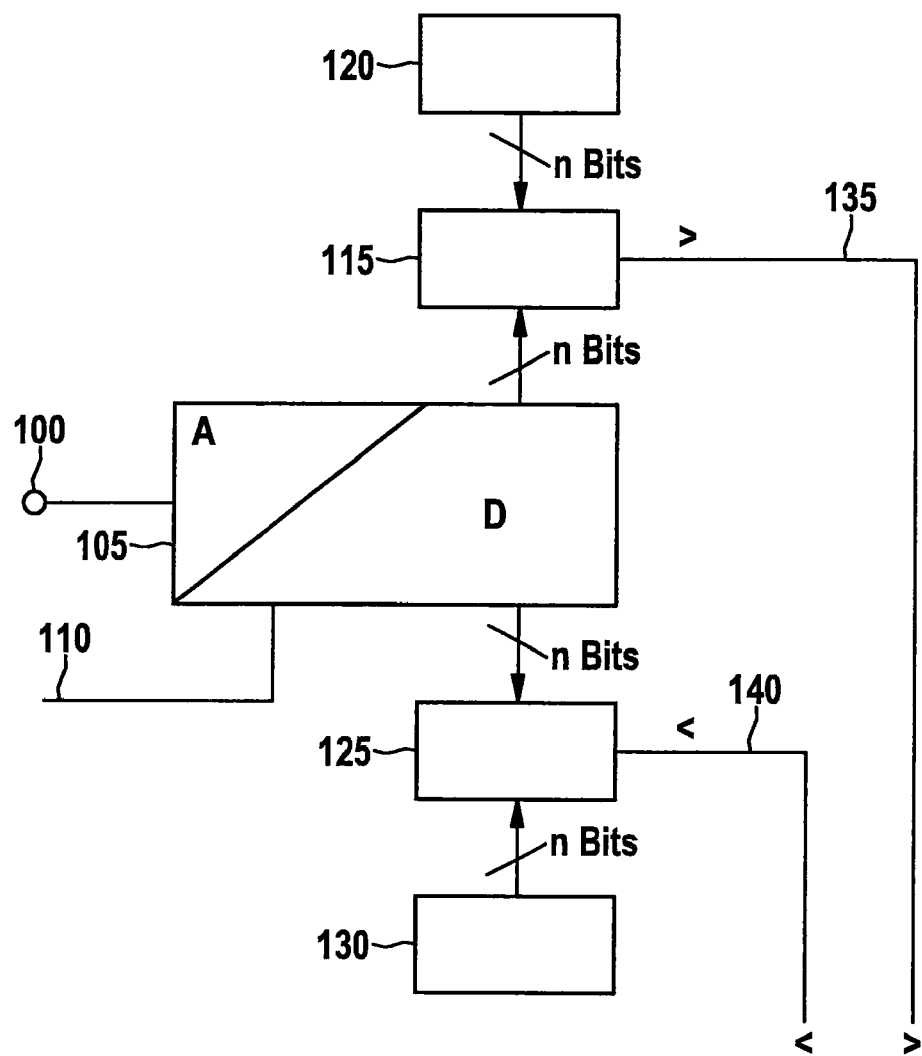
FIG. 1 shows a circuit configuration of a digital comparator for monitoring thresholds according to the related art.

The first part of the entire circuit configuration shown in FIG. 1 is known per se in the related art. The entire circuit configuration comes about by joining together the first circuit part with a second circuit part according to FIG. 2 or 3.

The first circuit part shown in FIG. 1 includes an analog/digital (A/D) converter 105 which converts an analog input variable, present at its analog input 100 present as an actual value of an electrical voltage value or current value of a controlled variable, to a digital output variable. As is also known per se, a scanning frequency for the digitization of analog signal 100 is supplied to the A/D converter via a separate input 110. The numerical value of the digital output variable of the A/D converter is in a direct proportional ratio to the analog input variable.

The digital output variable of A/D converter 105 is supplied both to a first digital comparator 115, which compares the value of the output variable to an upper threshold value 120 and, which may be, essentially simultaneously, via a second digital comparator 125 to a lower threshold value 130. As a result of these two comparison operations, at output 135, 140 of respective comparator 115, 125 there are present one of the three following points of information or a corresponding digital signal:

The value of the output variable of A/D converter 105 is
a. above upper threshold value 120;
b. below lower threshold value 130;
c. between lower threshold value 130 and upper threshold value 120.

Figure 2:
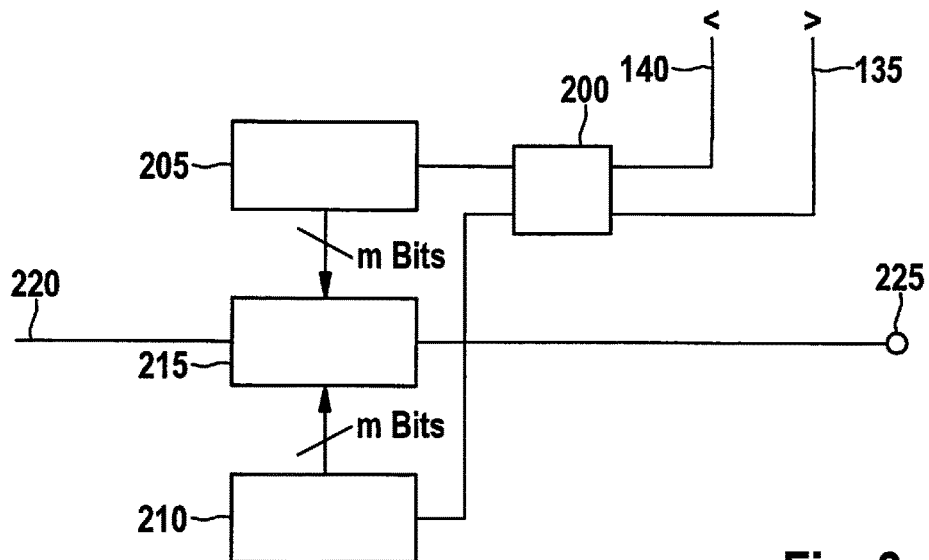
FIG. 2 shows a first exemplary embodiment of a digital circuit configuration, according to the present invention, for setting the pulse-width ratio of a pulse-width modulated (PWM) signal.
Figure 3:
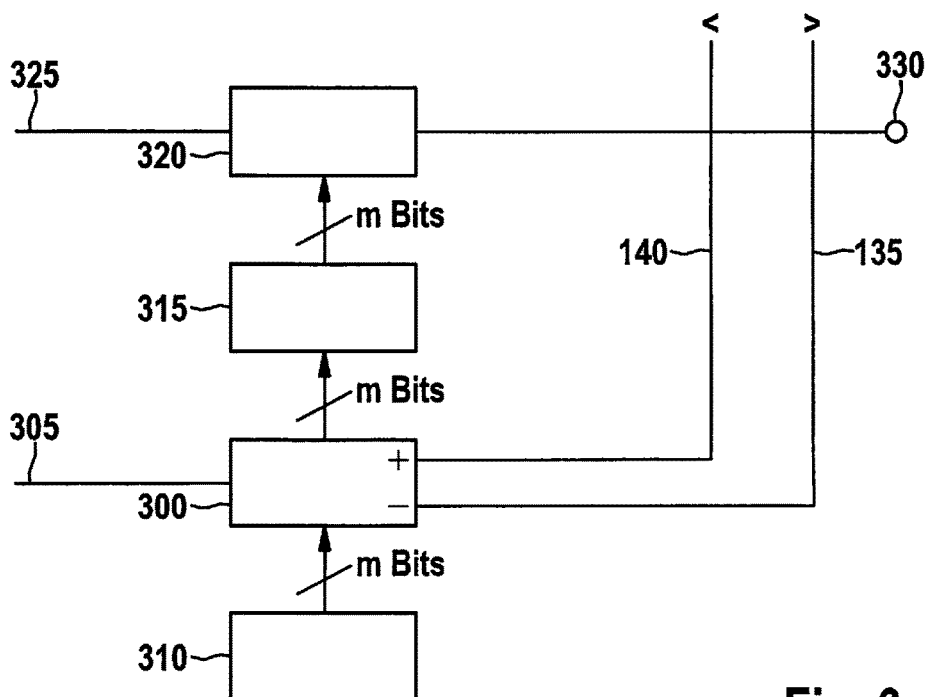
FIG. 3 shows a second exemplary embodiment of a digital circuit configuration, according to the present invention, for setting the pulse-width ratio of a pulse-width ratio PWM signal.

The possible points of information a.-c. are each used as input data or input variables 135, 140 of the circuit configurations according to the present invention, shown in FIGS. 2 and 3, which connect named A/D converter 105 and comparator, or rather comparators 115, 125 respectively to one timer unit 215, 320, which is able to generate the PWM signals mentioned, in such a way that the pulse-width ratio of the PWM signals present at output 225, 330 is able to be set.

In the case of the first exemplary embodiment, shown in FIG. 2, of the circuit configuration according to the present invention, input variables 135, 140 are first supplied to a condition-controlled, first digital comparator (115). Flip-flop 200 in the exemplary embodiment is a flip-flop, known per se, of the type "RS-FF" (i.e. reset-set). Depending on the value of the variable present at flip-flop 200, which signals either the exceeding of the upper threshold value (the above case a.) or the undershooting of the lower threshold value, from flip-flop 200, or rather its output in the first case, a PWM signal is selected having a first pulse-width ratio of x % 205, whereas in the second case (the above case b.), a PWM signal is selected having a second pulse-width ratio of y % 210.

The pulse-width ratio selected as described in each case is supplied, together with a clock pulse signal 220 to a timer 215. Timer 215 is configured in the present exemplary embodiment as a "capture/compare unit", i.e. it has the following operating modes
1. 'Timer Mode': Incrementing using various sources as clock pulse generator. In case of counter overflow, an interrupt may be triggered.
2. 'Capture Mode': At the occurrence of an external signal, the content of the associated (running) timer is stored. In this case, too, an interrupt may be triggered.
3. 'Compare Mode': The counter content of the associated timer is compared to that of a register. If there is agreement, an interrupt may be triggered.

The compare mode is used to generate a PWM signal In the case of exceeding, the counter supplies as output signal (225) a logical 1, for example, when the compare value is exceeded (in 205 or 210) and a logical 0 in the case of undershooting. The ratio of the duration of logical 1 to the duration of a complete counter pass is thus proportional to the compare value. In the method of the present invention, the timer signal is accordingly influenced as a function of the analog variable present. The results of the comparisons mentioned thus already supply one sufficiently good pulse-width ratio so that switchover taking place only between two states and the corresponding timer signal makes possible a coarser control loop as compared to the related art. At digital output 225 of the present circuit configuration, there is consequently present a corresponding pulse-width modulated signal.

If the counter is not used in the compare mode, an output signal 225, for example, may also be generated which makes available the information ">" or "<", immediately or after a changeable delay time, as digital information.

In the case of the second exemplary embodiment, shown in FIG. 3, of the circuit configuration according to the present invention, input variables 135, 140 are first supplied to an adder/subtractor 300. In this context, signal 135 delivered by upper comparator 115 is supplied to the subtraction input (−) of adder 300, and signal 140 delivered by lower comparator 125 is supplied to the addition input (+) of adder 300. In addition, a scanning frequency 305 (that is typically identical to 110) that is required for the digitization of analog signal 100 is supplied to adder 300 as well as a specified increment 310 for changing the pulse-width ratio.

In the case of the exceeding of upper threshold value 120 (above case a.), pulse-width ratio 315 is accordingly reduced by the amount of specified increment 310, whereas in the case of undershooting lower threshold value 130 (above case b.), the pulse-width ratio is increased by increment 310. It should be noted that increment 310 is freely configurable in both cases (above cases a. and b.).

Pulse width ratio 315, thus changed, is finally, in turn, supplied, together with a clock pulse signal 325, to a timer 320, which, also in the present exemplary embodiment, is developed as a "capture/compare unit" and thus has the functionality described above. At digital output 330 of the present circuit configuration, there is consequently present a corresponding pulse-width modulated signal. One advantage of the second exemplary embodiment compared to the first exemplary embodiment (FIG. 2) is that the pulse-width ratio over the entire possible range 0%-100% of the controlled variable (analog signal) is able to be tracked without intervention by the microcontroller, while in the first exemplary embodiment change is only made between two pulse-width ratios To change these two pulse-width ratios, however, a command execution of the microcontroller is required. When the timer is used, it is true that the pulse-width ratio may be decreased or increased in very small steps, namely, as a function of whether the analog signal is greater or smaller.

According to a third exemplary embodiment of the circuit configuration according to the present invention (not illustrated in the figures) the result of the A/D converter is transmitted to a timer unit mentioned, and is there compared to a specified value. This exemplary embodiment is of advantage particularly when the microcontroller used does not already have a threshold monitor (as is assumed in the preceding exemplary embodiments). In this case, compare units present in the timer module may be used, instead, as usual, to compare a counter value to the transmitted analog value. The further embodiment is essentially identical to the first two exemplary embodiments, but with the exception that comparators 115, 125 shown there and the comparison thresholds 120, 130 of the A/D converter are implemented in the timer module.

Figure 4:
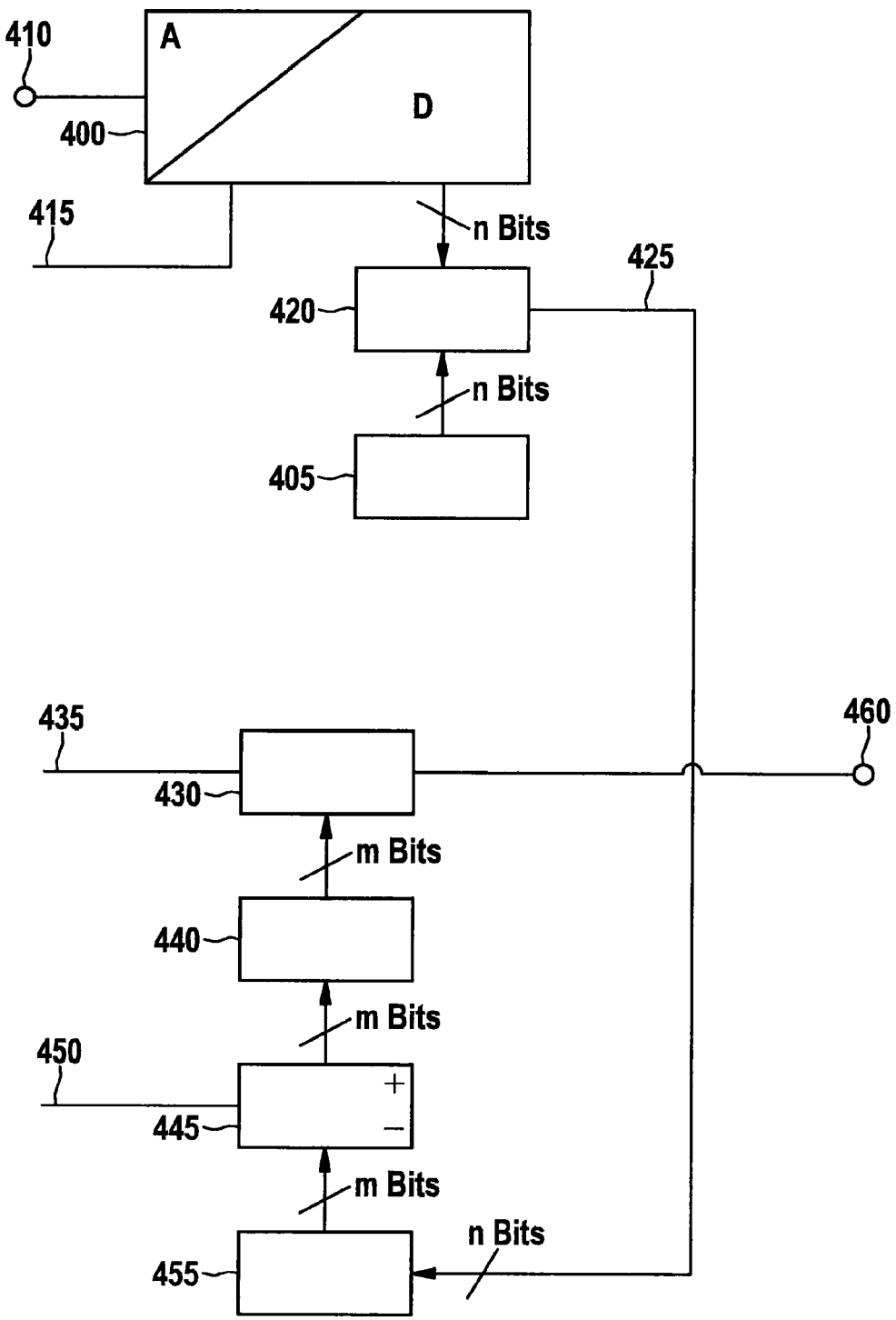
FIG. 4 shows an additional exemplary embodiment of a digital circuit configuration, according to the present invention, for setting the pulse-width ratio of a PWM signal.

According to a fourth exemplary embodiment of the circuit configuration according to the present invention, shown in FIG. 4, a change in the pulse-width ratio takes place by direct derivation from the deviation of the result of an A/D converter 400 (shown in the upper half of FIG. 4) from a specified setpoint value 405. As the input variables of A/D converter 400, an actual value 410 of an analog controlled variable present at an analog input, as well as a previously mentioned scanning frequency ("sample clock pulse") 415, are used. The either positive or negative difference value is then present at (digital) output 425 of A/D converter 400. The deviation mentioned is ascertained using a subtractor 420. On the digital side of A/D converter 400, the signal exchange and the signal processing between the A/D converter, subtractor 420 and setpoint encoder 405 takes place digitally using binary signals (designated here as "n bits").

In this exemplary embodiment, there is accordingly no two-step control, but a direct control about an average value.

In the lower half of FIG. 4, there is again a timer module which is formed by a capture-compare timer 430, which is operated in the manner described using a clock-pulse signal ("timer clock pulse") 435 as well as a pulse-width ratio 440. In addition, an adder 445 is situated, which is operated using a supplied scanning frequency 450 and an increment value encoder 455 supplying an increment. The bit signal ("n bits"), supplied by subtractor 420 is used as input signal of the increment value encoder 455. The signal exchange or the signal processing between timer 430, pulse-width encoder 440, adder 445 and increment value encoder 455 takes place digitally using binary signals (designated here as "m bits"). At (digital) output 460 of timer 430 and thus of the entire circuit configuration a pulse-width modulated signal is finally obtained.

The logic, not present in standard microcontrollers, which is additionally required for the setpoint value comparison mentioned, includes some of the logic components shown in FIG. 4, namely setpoint encoder 405, subtractor 420, increment value encoder 455 and adder 445.

The fourth exemplary embodiment (not shown in FIG. 4) may be developed in an even more flexible manner in that, by corresponding (optional) displacement of the ascertained difference from the current A/D value by 1 or more bit(s) to the right, one-half (one quarter, one eighth, etc.) or to the left, twice (four-fold, eight-fold, etc.) the difference from the current value of the pulse-width ratio is added.

In the final analysis, the A/D conversion described, based on discrete functioning elements, supplies a numerical value which is not only compared to a threshold value but is altogether transmitted to a timer and compared to a value. This means that the A/D converter already implemented in usual microcontrollers is replaced, according to the present invention, by the timer mentioned.

What is claimed is:

1. A digital circuit configuration for generating a pulse-width modulated signal, comprising:
   an A/D converter to convert an actual value of the analog variable, present at an input of the A/D converter, to a digital output variable, which is provided from the digital output of the A/D converter to a comparator unit;
   a comparator unit to compare the digital output variable to an upper threshold value and to a lower threshold value, and to output at an output of the comparator unit a signal indicating whether the output variable of the A/D converter lies above the upper threshold value or below the lower threshold value; and
   a digital timer connected to the output of the comparator unit, the digital timer being used to set a pulse-width ratio of a generated pulse-width modulated signal;
   wherein the digital timer includes a capture/compare unit.

2. A digital circuit configuration for generating a pulse-width modulated signal, comprising:
   an A/D converter to convert an actual value of the analog variable, present at an input of the A/D converter, to a digital output variable, which is provided from the digital output of the A/D converter to a comparator unit;
   a comparator unit to compare the digital output variable to an upper threshold value and to a lower threshold value, and to output at an output of the comparator unit a signal indicating whether the output variable of the A/D converter lies above the upper threshold value or below the lower threshold value; and
   a digital timer connected to the output of the comparator unit, the digital timer being used to set a pulse-width ratio of a generated pulse-width modulated signal;
   wherein the comparator unit includes a first digital comparator and at least one second digital comparator; and
   wherein the signals present at the output of the comparator unit are provided to a bistable flip-flop which, as a function of the value of the signal present at the flip-flop, selects a pulse-width modulated signal having a first pulse-width ratio or a pulse-width modulated signal having a second pulse-width ratio.

3. A digital circuit configuration for generating a pulse-width modulated signal, comprising:
   an A/D converter to convert an actual value of the analog variable, present at an input of the A/D converter, to a digital output variable, which is provided from the digital output of the A/D converter to a comparator unit;
   a comparator unit to compare the digital output variable to an upper threshold value and to a lower threshold value, and to output at an output of the comparator unit a signal indicating whether the output variable of the A/D converter lies above the upper threshold value or below the lower threshold value; and
   a digital timer connected to the output of the comparator unit, the digital timer being used to set a pulse-width ratio of a generated pulse-width modulated signal;
   wherein the comparator unit includes a first digital comparator and at least one second digital comparator; and
   wherein the signals present at the output of the comparator unit are provided to an adder/subtractor which, depending on the value of the signal present at the adder/subtractor, reduces or increases the pulse-width ratio by a specified increment.

4. The circuit configuration of claim 3, wherein the comparator unit includes a first digital comparator and at least one second digital comparator, wherein a signal provided by the first comparator is provided to the subtraction input of the adder/subtractor, wherein a signal provided by the at least second comparator is provided to the addition input of the adder/subtractor, wherein a scanning frequency is provided to the adder/subtractor, and wherein a specified increment is provided to the adder/subtractor for changing the pulse-width ratio.

5. A digital circuit configuration for generating a pulse-width modulated signal, comprising:
   an A/D converter to convert an actual value of the analog variable, present at an input of the A/D converter, to a digital output variable, which is provided from the digital output of the A/D converter to a comparator unit;
   a comparator unit to compare the digital output variable to an upper threshold value and to a lower threshold value, and to output at an output of the comparator unit a signal indicating whether the output variable of the A/D converter lies above the upper threshold value or below the lower threshold value; and
   a digital timer connected to the output of the comparator unit, the digital timer being used to set a pulse-width ratio of a generated pulse-width modulated signal;
   wherein the signal at the output of the A/D converter is compared to a specified value, and as a function of the result of the comparison and using the digital timer, either a first pulse-width modulated signal is emitted having a first frequency and a first pulse width, or a second pulse-width modulated signal is emitted having a second frequency and a second pulse width.

6. A digital circuit configuration for generating a pulse-width modulated signal, comprising:
- an A/D converter to convert an actual value of the analog variable, present at an input of the A/D converter, to a digital output variable, which is provided from the digital output of the A/D converter to a comparator unit;
- a comparator unit to compare the digital output variable to an upper threshold value and to a lower threshold value, and to output at an output of the comparator unit a signal indicating whether the output variable of the A/D converter lies above the upper threshold value or below the lower threshold value; and
- a digital timer connected to the output of the comparator unit, the digital timer being used to set a pulse-width ratio of a generated pulse-width modulated signal;
- wherein the setting of the pulse-width ratio takes place with the aid of the duty cycle over time of the pulse duration to the pulse period and as a function of a specified threshold value.

7. A digital circuit configuration for generating a pulse-width modulated signal, comprising:
- an A/D converter to convert an actual value of the analog variable, present at an input of the A/D converter, to a digital output variable, which is provided from the digital output of the A/D converter to a comparator unit;
- a comparator unit to compare the digital output variable to an upper threshold value and to a lower threshold value, and to output at an output of the comparator unit a signal indicating whether the output variable of the A/D converter lies above the upper threshold value or below the lower threshold value; and
- a digital timer connected to the output of the comparator unit, the digital timer being used to set a pulse-width ratio of a generated pulse-width modulated signal;
- wherein a change in the pulse-width ratio occurs using a deviation of the result of an A/D converter from a specified setpoint value, the deviation of the result being provided to the digital timer which is operated using a correspondingly changed pulse-width ratio.

* * * * *